(12) United States Patent
Carey et al.

(10) Patent No.: US 7,423,847 B2
(45) Date of Patent: Sep. 9, 2008

(54) CURRENT-PERPENDICULAR-TO-THE-PLANE SPIN-VALVE (CPP-SV) SENSOR WITH CURRENT-CONFINING APERTURES CONCENTRATED NEAR THE SENSING EDGE

(75) Inventors: Matthew J. Carey, San Jose, CA (US); Jeffrey R. Childress, San Jose, CA (US); Stefan Maat, San Jose, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 469 days.

(21) Appl. No.: 11/268,275

(22) Filed: Nov. 3, 2005

(65) Prior Publication Data

US 2007/0097558 A1    May 3, 2007

(51) Int. Cl.
  *G11B 5/39*  (2006.01)
(52) U.S. Cl. .................................. 360/324.1
(58) Field of Classification Search ................. 360/324, 360/324.1, 324.11, 324.12, 324.2
See application file for complete search history.

(56) References Cited

U.S. PATENT DOCUMENTS

| 5,287,238 | A | 2/1994 | Baumgart et al. | |
|---|---|---|---|---|
| 6,560,077 | B2 | 5/2003 | Fujiwara et al. | |
| 6,686,068 | B2 | 2/2004 | Carey et al. | |
| 6,781,799 | B2 | 8/2004 | Seyama et al. | |
| 7,289,305 | B2 * | 10/2007 | Fuke et al. | 360/324.12 |
| 2004/0042127 | A1 | 3/2004 | Hoshiya et al. | |
| 2004/0086751 | A1 * | 5/2004 | Hasegawa et al. | 428/692 |
| 2004/0130834 | A1 | 7/2004 | Nagasaka et al. | |
| 2004/0160700 | A1 | 8/2004 | Kagami et al. | |
| 2004/0169963 | A1 * | 9/2004 | Okuno et al. | 360/324.1 |
| 2004/0201929 | A1 | 10/2004 | Hashimoto et al. | |
| 2004/0214353 | A1 | 10/2004 | Nishiyama et al. | |
| 2004/0246631 | A1 * | 12/2004 | Dieny et al. | 360/324.1 |
| 2005/0002126 | A1 | 1/2005 | Fujiwara et al. | |
| 2005/0042478 | A1 * | 2/2005 | Okuno et al. | 428/694 TM |

(Continued)

OTHER PUBLICATIONS

Tanaka et al., "Spin-valve heads in the current-perpendicular-to-plane mode for ultrahigh-density recording", IEEE Transactions on Magnetics, 38 (1): 84-88 Part 1 Jan. 2002.

(Continued)

*Primary Examiner*—William J Klimowicz
(74) *Attorney, Agent, or Firm*—Thomas R. Berthold

(57) ABSTRACT

A current-perpendicular-to-the-plane spin-valve (CPP-SV) magnetoresistive sensor has an insulating layer with at least one aperture that confines the flow of sense current through the active region. The apertures are located closer to the sensing edge of the sensor than to the back edge of the sensor. The aperture (or apertures) are patterned by e-beam lithography, which enables the number, size and location of the apertures to be precisely controlled. The insulating layer may be located inside the electrically conductive nonmagnetic spacer layer, or outside of the magnetically active layers of the spin-valve. More than one insulating layer may be included in the stack to define conductive current paths where the apertures of the insulating layers overlap. The apertures are filled with electrically conductive material, typically the same material as that used for the spacer layer.

20 Claims, 6 Drawing Sheets

U.S. PATENT DOCUMENTS

| | | | |
|---|---|---|---|
| 2005/0068698 A1* | 3/2005 | Sato et al. | 360/324.12 |
| 2005/0094327 A1* | 5/2005 | Okuno et al. | 360/324.2 |
| 2005/0122633 A1* | 6/2005 | Nowak et al. | 360/324 |
| 2006/0034022 A1* | 2/2006 | Fukuzawa et al. | 360/324.1 |
| 2006/0050444 A1* | 3/2006 | Fukuzawa et al. | 360/324 |
| 2008/0013222 A1* | 1/2008 | Okuno et al. | 360/324.1 |

OTHER PUBLICATIONS

Tanaka et al., "Readout Performance of Confined-Current-Path Current-Perpendicular-to-Plane Heads", IEEE Transactions on Magnetics, vol. 40, No. 1, Jan. 2004, pp. 203-206.

Fukuzawa, et al., "MR Ratio Enhancement by NOL Current Confined Path Structures in CPP Spin Valves", IEEE Transactions on Magnetics, vol. 40, No. 4, Jul. 2004, pp. 2236-2238.

Oshima et al., "Current-perpendicular spin valves . . . layers for ultrahigh-density magnetic recording", IEEE Transactions on Magnetics, vol. 39, No. 5, Sep. 2003, pp. 2377-2380.

Fujiwara, et al., "Magnetic and Transport Properties of GMR/Spin-Valves and Their Components", MINT Spring Review, Apr. 2002, Univ of Alabama.

* cited by examiner

CURRENT-PERPENDICULAR-TO-THE-PLANE SPIN-VALVE (CPP-SV) SENSOR WITH CURRENT-CONFINING APERTURES CONCENTRATED NEAR THE SENSING EDGE

BACKGROUND OF THE INVENTION

1. Field of the Invention

The invention relates generally to a current-perpendicular-to-the-plane (CPP) magnetoresistive spin-valve (SV) sensor that operates with the sense current directed perpendicularly to the planes of the layers making up the sensor stack, and more particularly to a CPP-SV sensor with a confined path for the sense current.

2. Background of the Invention

One type of conventional magnetoresistive sensor used as the read head in magnetic recording disk drives is a "spin-valve" (SV) sensor. A single SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance. The magnetoresistance of the sensor is measured as ($\Delta R/R$), where $\Delta R$ is the maximum change in resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor. CPP-SV read heads are described by A. Tanaka et al., "Spin-valve heads in the current-perpendicular-to-plane mode for ultrahigh-density recording", IEEE Transactions on Magnetics, Vol. 38, No. 1, Jan. 2002, pp. 84-88.

In CPP-SV sensors, because the sense current flows perpendicular to all the layers in the sensor stack, the resistance of the active region (the free layer, spacer layer and pinned layer) is a relatively small part of the total resistance of the sensor. Due to its high resistivity, the antiferromagnetic layer can account for more than 90% of the total stack resistance. It is thus desirable to increase the resistance of the active region without significantly increasing the total resistance. One approach to achieving this is sometimes called a confined-current-path (CCP) sensor, wherein the sense current is forced to pass though only a portion of the area of the sensor stack. One type of CCP CPP-SV sensor has a partially-oxidized nano-oxide layer (NOL) in the active region, typically in the conductive spacer layer. The sense current is confined to flow only though the conductive non-oxidized areas of the NOL. The NOL thus increases both the resistance and the $\Delta R$ of the active region and therefore increases the magnetoresistance ($\Delta R/R$) of the sensor. CPP-SV sensors with NOLs are described by Oshima et al., "Current-perpendicular spin valves with partially oxidized magnetic layers for ultrahigh-density magnetic recording", IEEE Transactions on Magnetics, Vol. 39, No. 5, Sep. 2003, pp. 2377-2380; and by Fukuzawa, et al., "MR Enhancement by NOL Current-Confined-Path Structures in CPP Spin Valves", IEEE Transactions on Magnetics, Vol. 40, No. 4, Jul. 2004, pp. 2236-2238.

Because the formation of the conductive paths in the NOL is by oxidation and annealing of a very thin layer, the number and size of the conductive non-oxidized areas depends on the material properties, layer thickness, oxidation time, and anneal conditions. As a result it is difficult to reliably manufacture large quantities of CCP CPP-SV sensors with NOLs with predictable values of R and $\Delta R/R$. In addition, the conductive non-oxidized areas of the NOL are generally randomly distributed across the entire plane of the spacer layer. Fujiwara, et al., "Magnetic and Transport Properties of GMR/Spin-Valves and Their Components", University of Alabama Materials for Information Technology (MINT) Spring Review, April, 2002, proposes a CCP CPP-SV sensor wherein generally evenly distributed pin holes that function as confined current paths can be lithographically formed in the sensor stack. However, conductive paths evenly distributed across the area of the sensor stack may not necessarily result in the maximum possible improvement in readback sensitivity of a finished CPP-SV head.

What is needed is a CCP CPP-SV sensor that can be manufactured with the size and location of conductive areas carefully controlled to achieve the maximum improvement in readback sensitivity.

SUMMARY OF THE INVENTION

The sensor stack of a CCP CPP-SV sensor according to this invention has an insulating layer with an aperture. The aperture is located closer to the sensing edge of the sensor than to the back edge and provides a path for the sensor current through the active region. The aperture (or apertures) are patterned by e-beam lithography, which enables the number, size and location of the apertures to be precisely controlled. The apertures may have generally rectangular shapes as a result of lines patterned by the e-beam tool. The insulating layer may be located inside the electrically conductive non-magnetic spacer layer or on either side of the spacer layer. More than one insulating layer may be included in the stack to define conductive current paths where the apertures of the insulating layers overlap. The apertures are filled with electrically conductive material, typically the same material as that used for the spacer layer. Because the apertures are located near the sensing edge of the sensor the sense current is confined to flow near the sensing edge where the magnetic flux from the magnetic field being sensed is more concentrated. Therefore the placement of the apertures close to the sensing edge is beneficial for increasing the readback signal.

For a fuller understanding of the nature and advantages of the present invention, reference should be made to the following detailed description taken together with the accompanying figures.

DETAILED DESCRIPTION OF THE INVENTION

Figure 1:
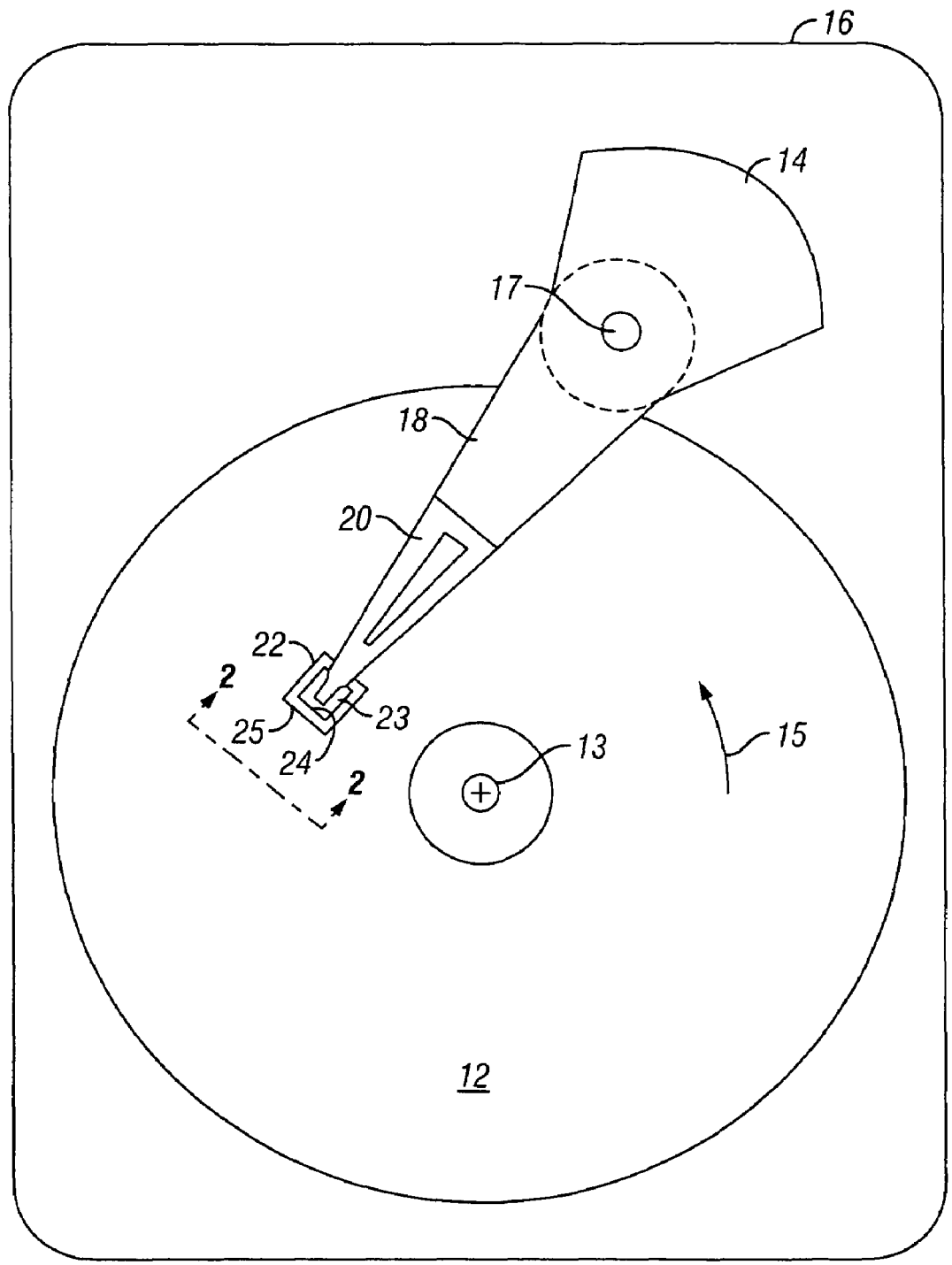
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
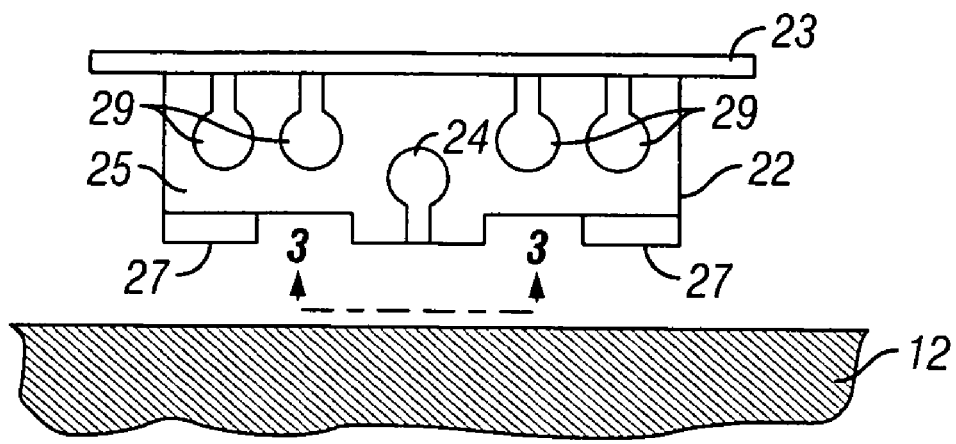
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
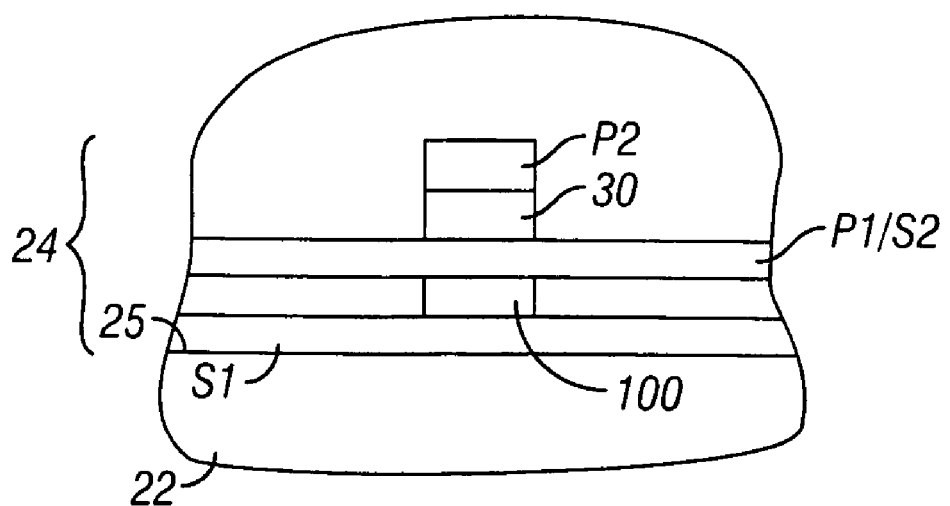
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1 and P2 separated by a write gap 30. The CPP-SV magnetoresistive sensor or read head 100 is located between two magnetic shields S1 and S2. The layers S2 and P1 may constitute a single shared pole P1/S2. which serves as both second read shield and first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
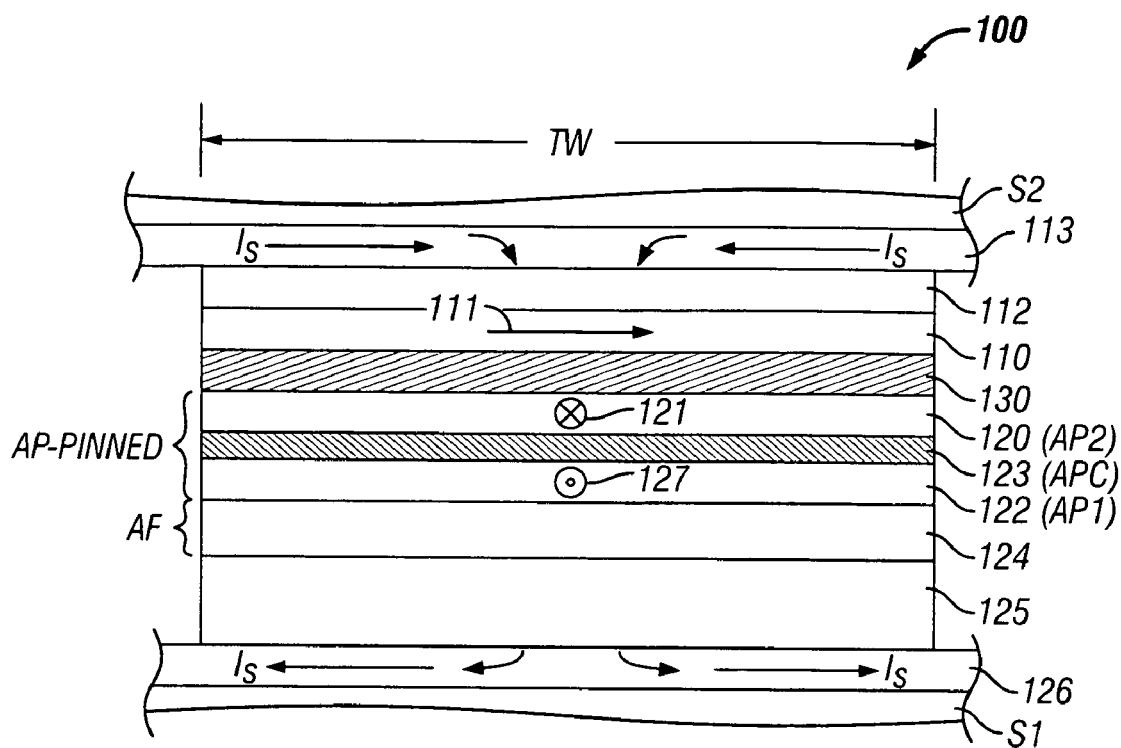
FIG. 4 is a cross-sectional schematic view of a CPP-SV read head showing the stack of layers located between the magnetic shield layers.

FIG. 4 is an enlarged sectional view as seen from the ABS showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor stack is patterned to have a trackwidth (TW) and includes a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The CPP-SV read head is depicted in FIG. 4 with the reference layer 120 being part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as CoPt or CoPtCr. While a CPP-SV read head with an AP-pinned structure is depicted in FIG. 4, the CPP-SV may instead use a "simple-pinned" structure, in which case a single ferromagnetic pinned layer would replace the AP-pinned structure and would have its magnetization direction pinned by being exchange-coupled to AF layer 124.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer. The electrical leads 126, 113 are optional because the shields S1, S2 are electrically conductive and can function as the electrical leads to the sensor stack.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, IrMnCr, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of Co, Fe or Ni, one of their alloys, or a multilayer of these materials, such as a CoFe/NiFe bilayer. A CoFe/NiFe bilayer is often used in the free layer. For example, AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, with a NiFe alloy, typically 10-30 Å thick, formed on the CoFe layer of the bilayer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistivity. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu—Al or Cu—Ti alloys.

Figure 5:
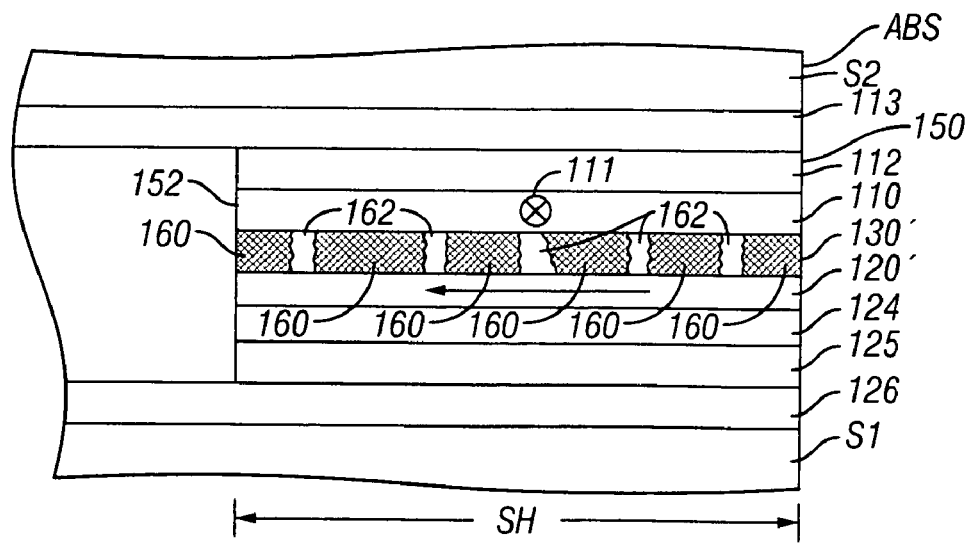
FIG. 5 is a side sectional view of a CPP-SV read head like that in FIG. 4 but with a nano-oxide layer (NOL) in the spacer layer and with a simple pinned layer instead of an AP-pinned structure.

FIG. 5 is a side sectional view of a CPP-SV read head like that in FIG. 4 with a NOL in the spacer layer 130' and with a simple pinned layer 120' instead of an AP-pinned structure. The sensor stack has a first or sensing edge 150 at the ABS and a second or back edge 152 located a distance called the "stripe height" (SH) from the sensing edge. The area A of the sensor stack through which the sense current flows is thus given approximately by TW×SH. The spacer layer 130' may be formed by oxidizing a Cu—Al alloy to form nonconductive alumina ($Al_2O_3$) regions 160 and conductive Cu regions 162. The sense current through the sensor stack is substantially confined to flow through the conductive regions 162 of spacer layer 130'. This type of NOL and the method for making it are described by Fukuzawa, et al., "MR Enhancement by NOL Current-Confined-Path Structures in CPP Spin Valves", *IEEE Transactions on Magnetics*, Vol. 40, No. 4, July 2004, pp. 2236-2238, and in U.S. Pat. No. 6,686,068. Because the nonconductive regions 160 are formed by oxidation of the entire spacer layer, the conductive regions 162 are generally randomly distributed within the entire spacer layer 130' between the sensing and back edges 150, 152, respectively. Also, the size and location of the conductive regions 162 can not be easily controlled because the extent of oxidation of the spacer layer is determined by many factors.

Figure 6:
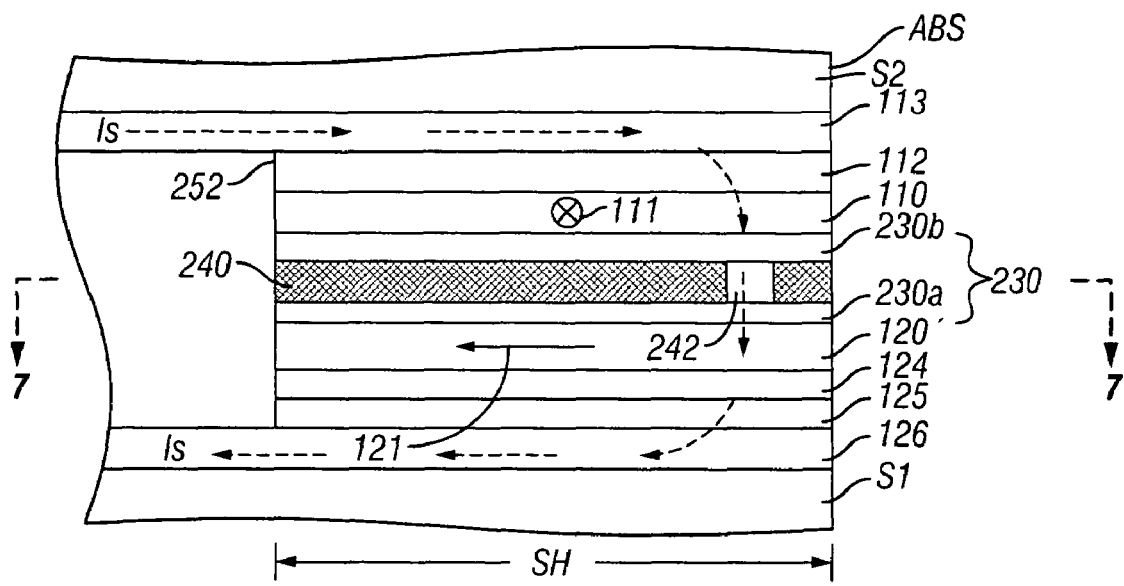
FIG. 6 is a side sectional view of one embodiment of a CPP-SV read head according to this invention.

FIG. 6 is a side sectional view of one embodiment of a CPP-SV read head according to the present invention. The spacer layer 230 includes two portions, conductive spacer layer 230a and conductive spacer layer 230b, that are separated by an insulating layer 240. Insulating layer 240 has an aperture 242 located closer to the sensing edge 250 of the sensor stack than to the back edge 252. The sense current $I_S$, as represented by the dashed arrows, flows perpendicularly through the sensor stack but is generally confined to flow through aperture 242.

The spacer layer 230 and insulating layer 240 with aperture 242 is formed in the following manner. The first conductive spacer layer 230a, typically Cu, is deposited to a thickness of approximately 20 Å over the pinned layer 120'. Next, the insulating layer 240, typically alumina, is deposited to a thickness of approximately 20 Å over the layer 230a. In addition to alumina, other materials suitable for insulating layer 240 include $SiO_2$, TiO, and MgO. A resist suitable for e-beam lithography, such as PMMA, is then deposited by spin coating over the insulating layer 240. A pattern corresponding to the desired shape for the aperture is then written by an electron-beam (e-beam) tool onto the resist. The exposed resist is then developed and the insulating layer 240 is ion-beam milled or reactive-ion-etched (RIE) to create the aperture 242 in the insulating layer 240. The resist is then removed. A hard-carbon layer may be added after deposition of insulating layer 240 and before applying e-beam resist. The design of the aperture is then transferred to the hard-carbon using ion-milling after exposing and developing the resist. This hard-carbon then acts as the mask for an RIE etch. After the aperture is formed a second conductive spacer layer 230b, typically Cu, is deposited over the insulating layer 240. This second layer of Cu will fill the aperture 242 and thus provide a conductive path between layers 230a and 230b. An ion-beam etch step may be required before the deposition of the Cu spacer 230b to fully remove any contaminants from the aperture or apertures.

Figure 7:
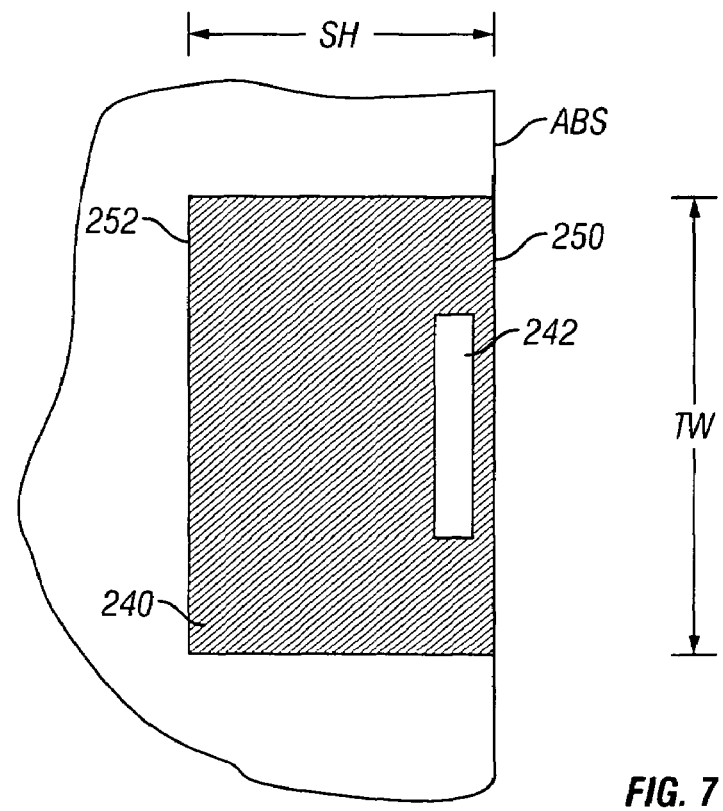
FIG. 7 is a view of section A-A from FIG. 6 and illustrates the aperture in an insulating layer in the sensor stack.

FIG. 7 is a view of section A-A from FIG. 6 and illustrates the aperture 242 in insulating layer 240. The aperture is generally rectangularly shaped because it is relatively easy to from lines with an e-beam tool. However, the aperture could have other shapes resulting from other patterns written by the e-beam tool. Although the insulating layer 240 is shown with a single aperture 242, multiple apertures may be formed, such as a plurality of rectangularly-shaped apertures. The aperture or apertures are preferably located closer to the sensing edge 250 than to the back edge 252 of the sensor stack. If the apertures are distributed throughout the area of the insulating layer 240, then preferably more than half the total area of the apertures should be located closer to the sensing edge 250 than to the back edge 252. The total area of the apertures determines the R and ΔR of the sensor stack. For example, for a typical CPP-SV read head without the insulating layer and aperture of the present invention and with a PtMn layer of 200 Å thickness, the resistance-area (RA) product of the sensor stack may be approximately 0.04 Ω-μm² and Δ(RA)/RA=ΔR/R=2.0%. These values are typical of a spin valve using CoFe alloys. The use of other materials, e.g., Heusler alloys, can increase RA to 0.05 Ω-μm² and ΔR/R to 5% or more. If a thick 20 Å insulating layer 240 is inserted inside this spacer layer and formed with apertures located in the front half (near the sensing edge 250) of the sensor stack making up about 10 percent of the area A, then Δ(RA) and the contribution to RA from the active layers of the SV stack would be increased approximately 10-fold. By contrast, the contribution to RA from the inactive layers (e.g., the AF layer), which otherwise would constitute about 90% of the total RA product, will be left relatively unchanged, resulting in only a total increase in RA of only about 2-fold. Hence, the effective ΔR/R of the CPP-SV stack with a 10% aperture area will be increased by a factor of 5 or more, corresponding in this example to an effective ΔR/R of approximately 15%.

While FIG. 6 illustrates the insulating layer 240 located within the spacer layer 230, the insulating layer 240 with aperture 242 could also be located below the spacer layer, e.g., between pinned layer 120' and spacer layer 230, or above the spacer layer, e.g., between spacer layer 230 and free layer 110.

Figure 8:
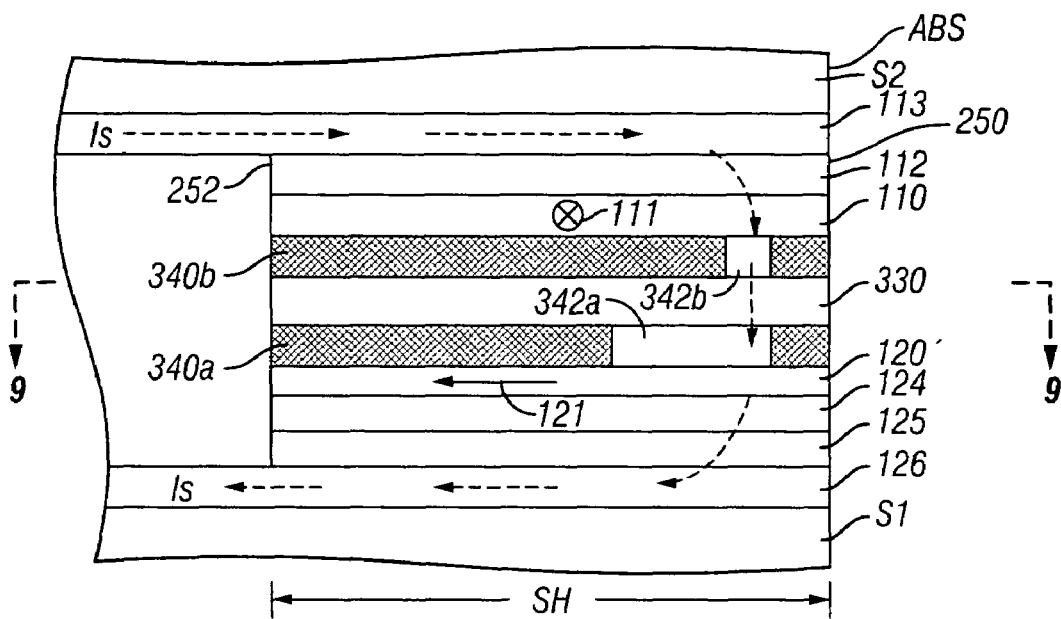
FIG. 8 is a side sectional view of another embodiment of a CPP-SV read head according to this invention.
Figure 9:
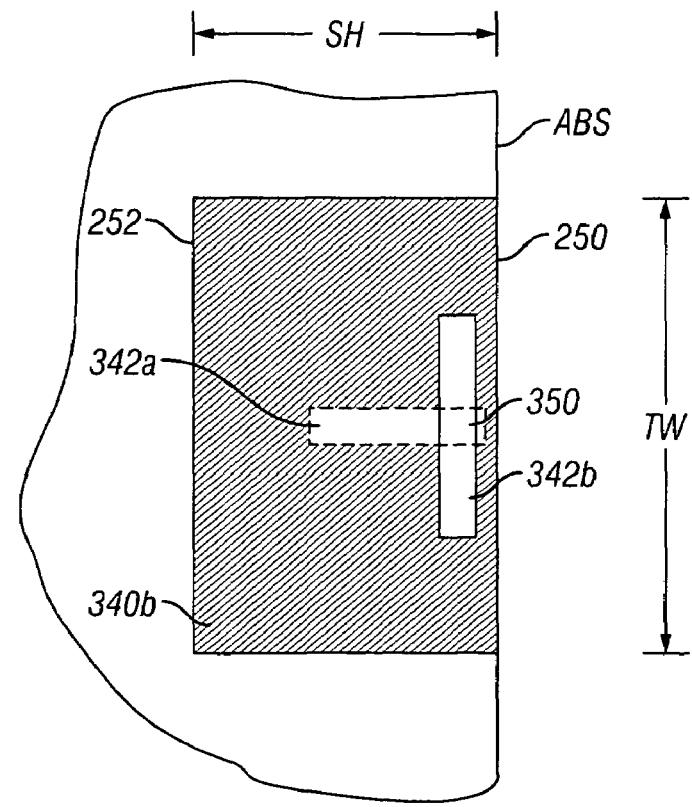
FIG. 9 is a view of section A-A from FIG. 8 and illustrates overlapping apertures in two insulating layers.

In the embodiment of FIGS. 6 and 7, only a single aperture-containing layer 240 is depicted. In such an embodiment, it is possible that after passing through the aperture 242, the current may tend to spread throughout the sensor. This could result in some of the current being directed away from the region of the sensor that will give the highest output in a read head. FIG. 8 is a side sectional view of another embodiment of a CPP-SV read head according to the present invention with a second aperture-containing layer that can limit this spread of current. The insulating layer in FIG. 8 comprises first and second insulating layers 340a, 340b, each having at least one aperture 342a, 342b, respectively. The first insulating layer 340a is located above the pinned layer 120' below the conductive nonmagnetic spacer layer 330. The second insulating layer 340b is located between the free layer 10 and the spacer layer 330. FIG. 9, which is a view of section A-A from FIG. 8, shows each aperture 342a, 342b as being generally rectangularly shaped. However, the two apertures are aligned non-parallel and preferably perpendicular to each other so that they define a current path 350 through spacer layer 330 where they overlap. Each insulating layer with its aperture is formed as described above with the apertures being formed by e-beam patterning of the resist. The apertures 342a, 342b could have different shapes and sizes. For example, aperture 342a could be a 80 nm×40 nm rectangle and aperture 342b could be a 30 nm×90 nm rectangle, resulting in a 30 nm×40 nm current path 350. Although each insulating layer 340a, 340b is shown with a single aperture, multiple apertures may be formed in each insulating layer, such as a plurality of generally parallel rectangularly shaped apertures in each insulating layer. This would result in a plurality of current paths like the path 350. The aperture or apertures are patterned so that the current path or paths are located closer to the sensing edge 250 than to the back edge 252 of the sensor stack.

In a variation of the embodiment of FIG. 8, the insulating layer 340a may be located on lead layer 126, i.e., between the substrate and the pinned layer 120', with layers 125, 124 and 120' then being located between insulating layer 340a and spacer layer 330. In addition to this placement of layer 340a, or as an alternative, layer 340b could be located above the free layer 110, i.e., with the free layer 110 between the spacer layer 330 and the second insulating layer 340b. This would allow the entire SV sensor to be made in a single film deposition process. This would allow for one or both of the aperture-containing layers 340a, 340b to be placed outside of the active region, thereby eliminating the need to stop the film deposition process in the middle of the active region. This will reduce the possibility of contamination within the SV sensor, insuring the highest ΔR/R.

Figure 10:
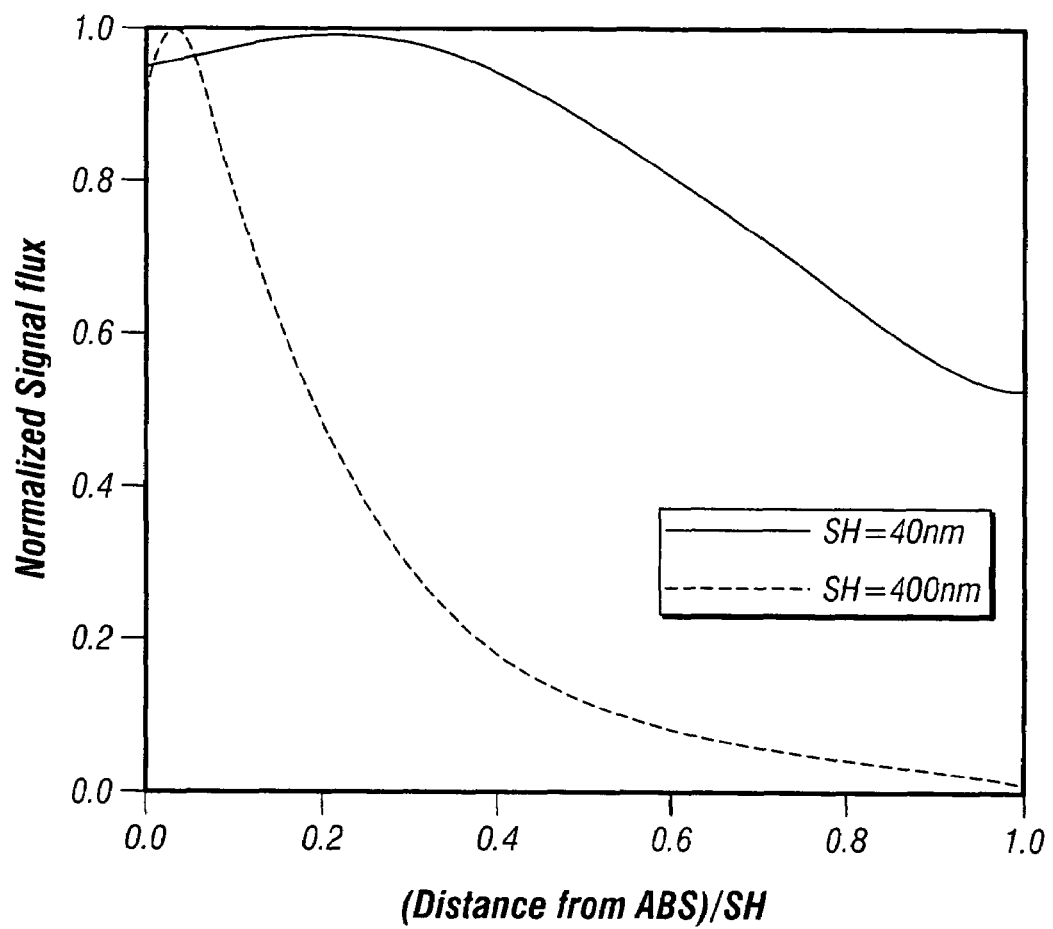
FIG. 10 is a curve showing the normalized signal flux from an external magnetic field being sensed as a function of distance from the sensing edge of a CPP-SV sensor for two sensors with different areas.

FIG. 10 is a curve showing the normalized signal flux from an external magnetic field being sensed as a function of distance from the ABS. The curve (solid line) for a relatively small sensor, i.e., one with SH of approximately 40 nm, shows that the flux has dropped by nearly 50% at the back edge of the sensor. The flux decreases even more rapidly toward the sensor back edge for larger sensors, as shown by the curve (dashed line) for a sensor with a SH of approximately 400 nm. FIG. 10 shows the advantage of the present invention, in that location of the apertures near the sensing edge will contribute significantly more to the overall signal than apertures located near the back edge. For the SH=40 nm sensor, if an aperture were placed at 32 nm away from the ABS (0.8 on the scale in FIG. 10) the sensor would only detect about 65% of the total flux. On the other hand, if the aperture were placed at 8 nm (0.2 on the scale), the sensor would achieve 100% of the optimal output. The use of e-beam lithography enables the relatively precise location of the apertures in the insulating layers, so that most of the surface area of the apertures can be located closer to the sensing edge than to the back edge of the sensor stack.

While the CPP-SV read heads shown in FIGS. 6 and 8 are "bottom-pinned" read heads because the pinned layer 120' is below the free layer 110, the free layer 110 can be located below the pinned layer 120'. The CPP-SV sensor may also be a dual spin-valve sensor, like the dual spin-valve structure for use as a CIP-SV sensor described in U.S. Pat. No. 5,287,238. Referring to FIG. 6, such a sensor would have a second electrically conducting nonmagnetic spacer layer (like layer 230) formed on top of free layer 110 and a second pinned layer (like layer 120') on top of the second nonmagnetic spacer layer. Thus a dual CPP-SV sensor according to this invention could have one or both of its spacer layers formed with the insulating layer or layers as described above and shown in FIG. 6 or FIG. 8.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields when a sense current is applied perpendicular to the planes of the layers in the sensor, the sensor comprising:
   a substrate;
   a stack of layers on the substrate and having a first edge for positioning near the magnetic field to be sensed and a second edge farther than the first edge from the magnetic field to be sensed, the stack comprising (a) a pinned ferromagnetic layer having an in-plane magnetization direction oriented generally orthogonal to said first edge; (b) a free ferromagnetic layer having an in-plane magnetization direction oriented substantially orthogonal to the magnetization direction of the pinned layer in the absence of an external magnetic field and substantially free to rotate in the presence of an external magnetic field; (c) an electrically conductive nonmagnetic spacer layer between the free ferromagnetic layer and the pinned layer; and (d) first and second insulating layers, each of the first and second insulating layers having one and only one generally rectangularly shaped aperture providing an electrically conductive path, wherein the length of the one and only one aperture in the first insulating layer is substantially non-parallel with the length of the one and only one aperture in the second insulating layer and wherein more than half the total of the area of both of the apertures is located closer to said first edge than to said second edge.

2. The sensor of claim 1 wherein both of the apertures are filled with electrically conductive material.

3. The sensor of claim 1 wherein each of the insulating layers is in contact with the conductive nonmagnetic spacer layer.

4. The sensor of claim 1 wherein both of the apertures are filled with the same material as the material of said conductive nonmagnetic spacer layer.

5. The sensor of claim 1 wherein the first insulating layer is located between the pinned layer and the conductive nonmagnetic spacer layer.

6. The sensor of claim 1 wherein the first insulating layer is located between the substrate and the pinned layer.

7. The sensor of claim 1 wherein the second insulating layer is located between the conductive nonmagnetic spacer layer and the free layer.

8. The sensor of claim 1 wherein the free layer is located between the spacer layer and the second insulating layer.

9. The sensor of claim 1 both of the apertures in each of the first and second insulating layers are filled with the same material as the material of the conductive nonmagnetic spacer layer.

10. The sensor of claim 1 further comprising an antiferromagnetic layer exchange-coupled to the pinned ferromagnetic layer for pinning the magnetization direction of the pinned layer.

11. The sensor of claim 1 wherein said pinned ferromagnetic layer is the reference layer in an antiparallel (AP) pinned structure comprising a first AP-pinned (AP1) ferromagnetic layer having an in-plane magnetization direction, a second AP-pinned (AP2) ferromagnetic reference layer having an in-plane magnetization direction substantially antiparallel to the magnetization direction of the AP 1 layer, and an AP coupling (APC) layer between and in contact with the AP1 and AP2 layers.

12. The sensor of claim 1 wherein the pinned layer is located between the substrate and the free layer.

13. The sensor of claim 1 wherein the sensor is a magnetoresistive read head for reading magnetically recorded data from tracks on a magnetic recording medium, and wherein the substrate is a first shield formed of magnetically permeable material.

14. The sensor of claim 1 wherein the sensor is a dual spin-valve sensor.

15. A current-perpendicular-to-the-plane magnetoresistive read head for reading magnetically recorded data from tracks on a magnetic recording medium, the head comprising:
a first shield layer of magnetically permeable material;
a sensor stack on the first shield layer and having a sensing edge for positioning near the recording medium and a back edge farther than the sensing edge from the recording medium, the sensor stack comprising:
a pinned ferromagnetic layer having an in-plane magnetization direction oriented generally orthogonal to said sensing edge;
a free ferromagnetic layer having an in-plane magnetization direction oriented substantially orthogonal to the magnetization direction of the pinned layer in the absence of an external magnetic field;
an electrically conductive nonmagnetic spacer layer between the pinned layer and the free layer; and
first and second electrically insulating layers, each having at least one e-beam patterned electrically conductive aperture, wherein more than half the surface area of said at least one aperture in each of the first and second insulating layers is located closer to said sensing edge than to said back edge, wherein said at least one aperture in each of the first and second insulating layers is generally rectangularly shaped, and wherein the length of the at least one aperture in the first insulating layer is substantially non-parallel with the length of the at least one aperture in the second insulating layer; and
a second shield layer of magnetically permeable material on the sensor stack.

16. The read head of claim 15 wherein the first insulating layer is located between the pinned layer and the conductive nonmagnetic spacer layer.

17. The read head of claim 15 wherein the first insulating layer is located between the first shield layer and the pinned layer.

18. The read head of claim 15 wherein the second insulating layer is located between the conductive nonmagnetic spacer layer and the free layer.

19. The read head of claim 15 wherein the free layer is located between the spacer layer and the second insulating layer.

20. The read head of claim 15 wherein said at least one aperture in each of the first and second insulating layers is filled with the same material as the material of the conductive nonmagnetic spacer layer.

* * * * *